United States Patent
Pietromonaco

(10) Patent No.: US 10,250,234 B2
(45) Date of Patent: Apr. 2, 2019

(54) SIGNAL GENERATION AND WAVEFORM SHAPING

(71) Applicant: ARM Limited, Cambridge (GB)

(72) Inventor: David Pietromonaco, San Jose, CA (US)

(73) Assignee: ARM Limited, Cambridge (GB)

( * ) Notice: Subject to any disclaimer, the term of this patent is extended or adjusted under 35 U.S.C. 154(b) by 171 days.

(21) Appl. No.: 14/750,171

(22) Filed: Jun. 25, 2015

(65) Prior Publication Data

US 2016/0380620 A1    Dec. 29, 2016

(51) Int. Cl.
| | |
|---|---|
| *G06F 1/04* | (2006.01) |
| *H03K 3/012* | (2006.01) |
| *H02M 7/48* | (2007.01) |
| *H03K 3/017* | (2006.01) |
| *H03K 5/04* | (2006.01) |
| *H02M 3/158* | (2006.01) |

(52) U.S. Cl.
CPC ............ *H03K 3/012* (2013.01); *H02M 7/48* (2013.01); *H03K 3/017* (2013.01); *H03K 5/04* (2013.01); *H02M 3/1584* (2013.01)

(58) Field of Classification Search
CPC ....... H02M 2007/4815; H02M 3/1584; H02M 5/297; H02M 5/458; H02M 7/4807; H02M 7/797
See application file for complete search history.

(56) References Cited

U.S. PATENT DOCUMENTS

| | | | |
|---|---|---|---|
| 2005/0180181 A1* | 8/2005 | Gaudreau | H02J 1/10 363/71 |
| 2005/0218876 A1 | 10/2005 | Shinichi | |
| 2011/0127849 A1* | 6/2011 | Yoon | H03J 3/20 307/109 |
| 2012/0092908 A1* | 4/2012 | Piotr | H02M 3/1584 363/71 |
| 2014/0198538 A1* | 7/2014 | Kimura | H02M 3/3376 363/21.09 |
| 2014/0327426 A1* | 11/2014 | Shterzer | H03K 3/53 323/364 |
| 2015/0188437 A1* | 7/2015 | Chan | H02M 3/1584 363/46 |

FOREIGN PATENT DOCUMENTS

| | | |
|---|---|---|
| DE | 2558135 A1 | 7/1976 |
| DE | 102010060687 A1 | 5/2012 |
| EP | 2863528 A1 | 4/2015 |

OTHER PUBLICATIONS

PCT International Search Report and Written Opinion; PCT/GB2016/051821; dated Sep. 20, 2016.

* cited by examiner

*Primary Examiner* — Sibin Chen
(74) *Attorney, Agent, or Firm* — Pramudji Law Group PLLC; Ari Pramudji

(57) ABSTRACT

Measures, including apparatus, methods and computer program products, for generating an output signal with a defined waveform shape are provided. A plurality of switched inductor arrangements are each connected in parallel to generate a combined output signal. Each of the switched inductor arrangements are selectively enabled, wherein the number of enabled switched inductor arrangements is varied to define a waveform shape of the combined output signal.

21 Claims, 3 Drawing Sheets

US 10,250,234 B2

SIGNAL GENERATION AND WAVEFORM SHAPING

TECHNICAL FIELD

The present disclosure relates to signal generation. In particular, but not exclusively, the present disclosure relates to waveform shaping or modulation of generated signals.

BACKGROUND

Signal generation techniques are used in a number of electronic and electrical applications for many different purposes including telecommunications and power control. In the context of power control systems, signal generation techniques allow control of the electrical power supplied to electrical devices. A popular known signal generation technique for power control systems is Pulse Width Modulation (PWM), which allows a digital control system to generate variable voltage output levels and/or analogue output signals. PWM techniques utilise a generated series of pulses, typically of equal magnitude but variable width, which control the level of power supplied. To generate direct current (DC) output signals, PWM uses pulses of a constant width to generate an output signal at a particular voltage level. To generate alternating current (AC) output signals, pulses of varying width are used instead. To use PWM for relatively high power applications, the switching device which generates the pulse series is required to be rated for the necessary output power levels and as such are relatively large and expensive.

SUMMARY

According to a first aspect, apparatus is provided, comprising:
 a plurality of switched inductor arrangements; and
 control circuitry to selectively enable each of the plurality of switched inductor arrangements,
 wherein the plurality of switched inductor arrangements are connected in parallel to generate a combined output signal, and wherein the control circuitry is configured to vary the number of enabled switched inductor arrangements to define a waveform shape of the combined output signal.

According to a second aspect, a method is provided, comprising:
 selectively enabling each of a plurality of switched inductor arrangements, wherein the plurality of switched inductor arrangements are connected in parallel to generate a combined output signal; and
 varying the number of enabled switched inductor arrangements to define a waveform shape of the combined output signal.

According to a third aspect, there is provided a computer program product (for example computer software), adapted to perform the method of the second aspect. According to embodiments, a computer program product is provided, comprising a non-transitory computer-readable storage medium having computer readable instructions stored thereon, the computer readable instructions being executable by a computerized device to cause the computerized device to perform the method of the second aspect.

According to a fourth aspect, a waveform shaping circuit is provided, comprising:
 a plurality of switched inductor arrangements; and
 control circuitry to selectively enable each of the plurality of switched inductor arrangements,
 wherein the plurality of switched inductor arrangements are connected in parallel to generate a combined output signal, and wherein the control circuitry is configured to vary the number of enabled switched inductor arrangements to define a waveform shape of the combined output signal.

Further aspects, features and advantages will be apparent from the following description of examples, which is to be read in conjunction with the accompanying drawings.

DETAILED DESCRIPTION

Signal generation measures, including methods, apparatus and computer program products are disclosed, which utilise a plurality of switching arrangements connected in parallel to generate a combined output signal.

Figure 1:
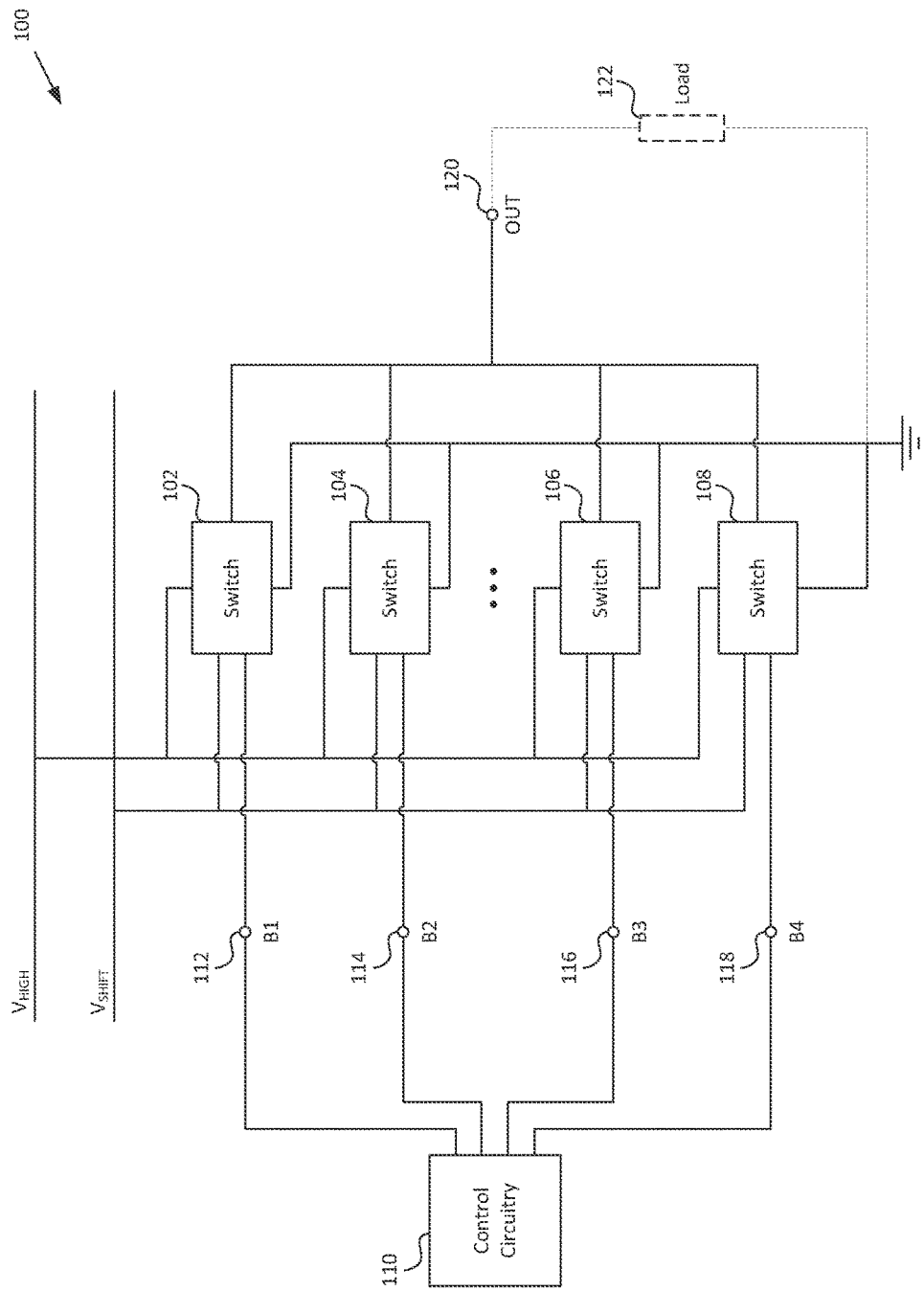
FIG. 1 schematically illustrates an example signal generation apparatus according to embodiments.

FIG. 1 illustrates an example signal generation apparatus 100. Apparatus 100 comprises a plurality of switched inductor arrangements 102, 104, 106, 108. The embodiments depicted in FIG. 1 show four switched inductor arrangements, however further embodiments may comprise more or fewer switched inductor arrangements. The switched inductor arrangements 102, 104, 106, 108 are arranged in parallel to generate a combined output signal, OUT. In embodiments, the outputs of each switched inductor arrangement 102, 104, 106, 108 are connected together at output terminal 120. In such embodiments, the outputs of each of the switched inductor arrangements 102, 104, 106, 108 are summed together to generate the combined output signal. The number of enabled switched inductor arrangements therefore influences the voltage of the combined output signal. During operation of apparatus 100, the combined output signal may be supplied to an electrical device, depicted in FIG. 1 as electrical load 122.

Control circuitry 110 is used to selectively enable each of the plurality of switched inductor arrangements 102, 104, 106, 108. Control circuitry 110 may for example comprise a processor or processing system. Control circuitry 110 is configured to vary the number of enabled switched inductor arrangements 102, 104, 106, 108 to define a waveform shape of the combined output signal. In this manner, apparatus 110 may generate a combined output signal with an arbitrarily shaped waveform, such as sine waves, triangle waves, square waves or sawtooth waves for example.

Utilising a plurality of switched inductor arrangements reduces the requirements on each individual switched inductor arrangement. For example, the maximum current rating required for each switched inductor arrangement may be reduced, as the supplied current of the combined output signal can be provided by the plurality of switched inductor arrangements in combination. Furthermore, power dissipation may be improved, as the dissipated power is spread across the various switched inductor arrangements, therefore lowering device temperatures and enabling the use of lower cost cooling solutions. Manufacturing requirements may also/alternatively be improved as the use of surface mount devices may be enabled which are more cost effective in production compared to high current devices which require hand connected wiring. Furthermore, by varying the number of enabled switched inductor arrangements to define the waveform shape of the combined output signal, additional power dissipation efficiencies and device cost improvements may be achieved, as described further in relation to FIG. 3 below.

In embodiments, the control circuitry 110 includes a plurality of control terminals 112, 114, 116, 118. In the embodiments depicted in FIG. 1, the control terminals 112, 114, 116, 118 are each connected to a corresponding one of the plurality of switched inductor arrangements 102, 104, 106, 108. The control circuitry 110 is configured to generate a plurality of switch signals B1, B2, B3, B4 at the control terminals 112, 114, 116, 118. The switch signals B1, B2, B3, B4 selectively enable the corresponding switched inductor arrangements 102, 104, 106, 108. In some embodiments, when a given switched inductor arrangement 102, 104, 106, 108 is enabled, a pulse signal is generated at the output of that switched inductor arrangement. Through the parallelisation of the switched inductor arrangements 102, 104, 106, 108, any contemporaneous pulse signals are summed at output terminal 120 to form the desired output signal waveform shape.

One or more supply voltages are also supplied to the switched inductor arrangements 102, 104, 106, 108 for use in generating the respective output signals. In the embodiments depicted in FIG. 1, two supply voltages, $V_{HIGH}$ and $V_{SHIFT}$ are supplied to each switched inductor arrangement 102, 104, 106, 108. In alternative arrangements, more or fewer supply voltages may be utilised, for example in accordance with the number of voltage shifting stages comprised within the switched inductor arrangements 102, 104, 106, 108.

Figure 2:
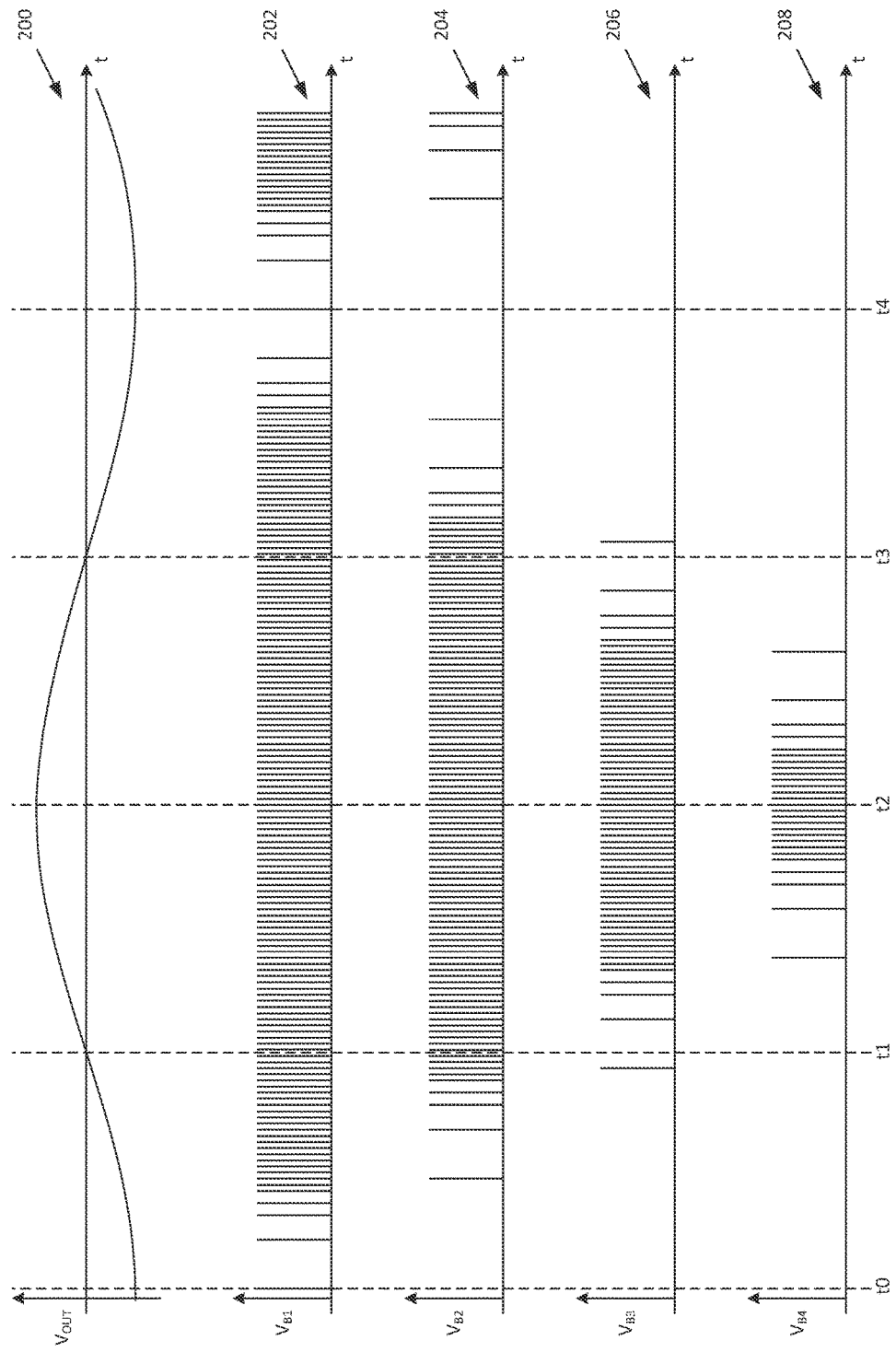
FIG. 2 shows an example signal generation method according to embodiments.

FIG. 2 illustrates an example operation of apparatus 100 for controlling the waveform shape of a combined output signal. In the embodiments depicted in FIG. 2, the desired waveform shape of the combined output signal, OUT, is a sine wave, as depicted in graph 200. The switch signals B1, B2, B3, B4, applied to switched inductor arrangements 102, 104, 106, 108 respectively, are depicted in graphs 202, 204, 406 and 208. When a particular switch signal B1, B2, B3, B4 transitions to a relatively high voltage state, the corresponding switched inductor arrangement 102, 104, 106, 108 becomes enabled. Hence, in some embodiments, the switch signals B1, B2, B3, B4, depicted in graphs 202, 204, 406 and 208 can also be seen to be representative of the pulse outputs from each of the corresponding switched inductor arrangements 102, 104, 106, 108. In the embodiments shown in FIG. 2, it can be seen that the switching frequency of the switched inductor arrangements 102, 104, 106, 108 is higher than the frequency of the target output waveform. Utilising a switching frequency for the switched inductor arrangements 102, 104, 106, 108 that is significantly higher than the frequency of the target output waveform may help to reduce distortion in the combined output signal. In order to more clearly illustrate the relationship between the switch signals B1, B2, B3, B4 and the combined output signal OUT, the switch signals have been depicted as an impulse train. However, in practice, the switch signals remain high for a sufficient period to adequately enable the switched inductor arrangement, as described further in relation to FIG. 3 below. Whereas, in FIG. 2, each of the switched inductor arrangements 102, 104, 106, 108 may become enabled when the corresponding switch signal B1, B2, B3, B4 transitions from a relatively low voltage state to a relatively high voltage state, in alternative embodiments (not shown), a switched inductor arrangement 102, 104, 106, 108 may alternatively become enabled when the corresponding switch signal B1, B2, B3, B4 transitions from a relatively high voltage state to a relatively low voltage state.

Time t0 corresponds with a trough in the target output waveform, and at this point, a relatively low number of the switched inductor arrangements 102, 104, 106, 108 are enabled. In the embodiments shown in FIG. 2, only switched inductor arrangement 102 is enabled at t0, as can be seen from switch signal B1 in graph 202. Between t0 and t1, the voltage of the target output waveform is required to increase, and therefore, the number of enabled switched inductor arrangements 102, 104, 106, 108 is increased, such that two switched inductor arrangements start to become simultaneously enabled. As the voltage of the target output waveform further increases, so does the number of enabled switched inductor arrangements 102, 104, 106, 108, such that around t1, three switched inductor arrangements begin to be simultaneously enabled, and by the peak of the target output waveform at t2, all four switched inductor arrangements are simultaneously enabled. Hence, it can be seen that at a peak of the target output waveform, a relatively high number of the switched inductor arrangements 102, 104, 106, 108 are enabled. Subsequently, between the peak of the target output waveform at t2 and the trough in the target output waveform at t4, the number of enabled switched inductor arrangements 102, 104, 106, 108 is decreased again.

In some embodiments, in addition to the number of enabled switched inductor arrangements 102, 104, 106, 108, the switching rate of each of the switched inductor arrangements may also be varied over time, as depicted in FIG. 2. In this manner, the total rate of pulses which contribute to the combined output signal can be controlled with a finer granularity. For example, as depicted in FIG. 2 between t0 and 1, the voltage of the combined output signal may be initially increased by increasing the switching rate of the first switched inductor arrangement 102 from a relatively low switching rate to a relatively high switching rate. Thereafter, the voltage of the combined output signal may be further increased by enabling a second switched inductor arrangement 104, and yet further increased by increasing the switching rate of the second switched inductor arrangement 104 from a relatively low switching rate to a relatively high switching rate. This same technique can be applied with the remaining switched inductor arrangements 106, 108 to further increase the voltage of the combined output signal between t1 and t2, and my be applied similarly in reverse to more gradually decrease the voltage of the combined output signal between t2 and t4, as illustrated in FIG. 2. Additionally, or alternatively to the switching rate, the pulse width of each of the pulses may be similarly varied to more gradually increase or decrease the voltage of the combined output signal.

Whereas in FIG. 2 the combined output signal, OUT, is shown to be generated from the combined outputs of four switched inductor arrangements 102, 104, 106, 108, in alternative arrangements more or fewer switched inductor arrangements may be used in similar fashion. In such embodiments, the control circuitry is configured to vary the number of enabled switched inductor arrangements 102, 104, 106, 108 over a wavelength of the combined output signal OUT, such that relatively more switched inductor arrangements are enabled during a peak in the output waveform, and relatively fewer switched inductor arrangements are enabled during a trough in the output waveform. Furthermore, whereas in FIG. 2 the target output waveform is shown to be a sine wave, it can be seen that any arbitrarily shaped waveform may be generated using the measures described herein.

In some embodiments, the control circuitry 110 is configured to generate the various switch signals B1, B2, B3, B4 internally. For example, control circuitry 110 may be configured to generate a given switch signal by toggling a corresponding output terminal as required. In some such embodiments, control circuitry 110 is configured to generate switch signals, at least two of which are asynchronous with respect to each other. By reducing synchronisation amongst the various switch signals B1, B2, B3, B4, jitter in the combined output signal caused by precise synchronisation between switch signals may be alleviated.

In further embodiments, the control circuitry 110 is configured to generate the various switch signals B1, B2, B3, B4 using one or more clock signals. Such a clock signal may be selectively passed to the respective switched inductor arrangement 102, 104, 106, 108 by the control circuitry 110 as required. Such a technique may be referred to as gating the clock signal. In this manner some of the processing burden for generating the switch signal may be alleviated. Furthermore, by using such a technique, the control circuitry 110 is not required to operate as fast as the frequency of the generated switch signals. Therefore, with a sufficiently high frequency clock signal, high switch signal frequencies can be achieved with control circuitry 110 operating at a relatively lower frequency. Enabling the apparatus 100 to utilise control circuitry 110 which operates at a relatively lower frequency may enable corresponding cost and/or power savings.

In some arrangements, multiple different clock signals may be used to generate the various switch signals B1, B2, B3, B4. In some such embodiments, at least two of the clock signals used to generate two or more of the various switch signals are asynchronous. Hence, in such arrangements, at least two of the generated switch signals B1, B2, B3, B4 are asynchronous with respect to each other. As described above, by reducing synchronisation amongst the various switch signals B1, B2, B3, B4, the jitter in the combined output signal caused by precise synchronisation between switch signals may be alleviated. Asynchronous clock signals may comprise clock signals that are out of phase with respect to one another and/or of different frequencies. Hence, various embodiments are envisaged in which at least two of the switched inductor arrangements 102, 104, 106, 108 are switched asynchronously.

In some arrangements, one or more of the switched inductor arrangements 102, 104, 106, 108 may each be selectively connectable a plurality of clock signals, each of which have different frequency or duty cycle characteristics. In embodiments, control circuitry 110 may select of which of the various possible clock signals to connect to a given switched inductor arrangement 102, 104, 106, 108, and therefore which clock signal is used to generate the respective switch signal B1, B2, B3, B4. By using such a technique, a finer degree of control over the total rate and/or duration of pulses which contribute to the combined output signal can be exercised by control circuitry 110, without requiring control circuitry 110 to operate as fast as the frequency of the generated switch signals.

In the embodiments depicted in FIG. 1, output terminals 112, 114, 116, 118 are each connected to a corresponding one of the plurality of switched inductor arrangements 102, 104, 106, 108. In alternative embodiments (not shown), a given output terminal 112, 114, 116, 118 may be connected to more than one of the plurality of switched inductor arrangements 102, 104, 106, 108. Hence, in some embodiments, the various switched inductor arrangements 102, 104, 106, 108 may be split into a number of subsets, where each of the switched inductor arrangements in a given group are enabled collectively. In such embodiments, a given switch signal is provided to a plurality of switched inductor arrangements 102, 104, 106, 108, such as all of the switched inductor arrangements in a particular subset for example. Such a technique may be referred to as banking of the switched inductor arrangements, and may aid in reducing the complexity of the control circuitry 110 for controlling large numbers of switched inductor arrangements.

In FIG. 2, the generation of the various switch signals B1, B2, B3, B4 has been configured such that each switched inductor arrangement 102, 104, 106, 108 is only enabled once the target output waveform exceeds a certain voltage level. The operation has been depicted in this way to more clearly illustrate how many of the switched inductor arrangements 102, 104, 106, 108 are enabled at any given point of the waveform. However, in further arrangements, the distribution of enabled switched inductor arrangements 102, 104, 106, 108 is more evenly distributed throughout the output waveform. In such arrangements, a more even distribution of power between the various switched inductor arrangements 102, 104, 106, 108 may be achieved, thereby also spreading the cooling requirements more evenly etc. As an example, in FIG. 2, near the troughs of the target output waveform at t0 and t4, it can be seen that the first switched inductor arrangement 102 is enabled several times without any of the other switched inductor arrangements 104, 106, 108 being used. In the aforementioned further arrangements, a greater number of the available switched inductor arrangements 102, 104, 106, 108 may be used during this period, for example by using a turn-based ordering scheme, or a random distribution scheme.

Figure 3:
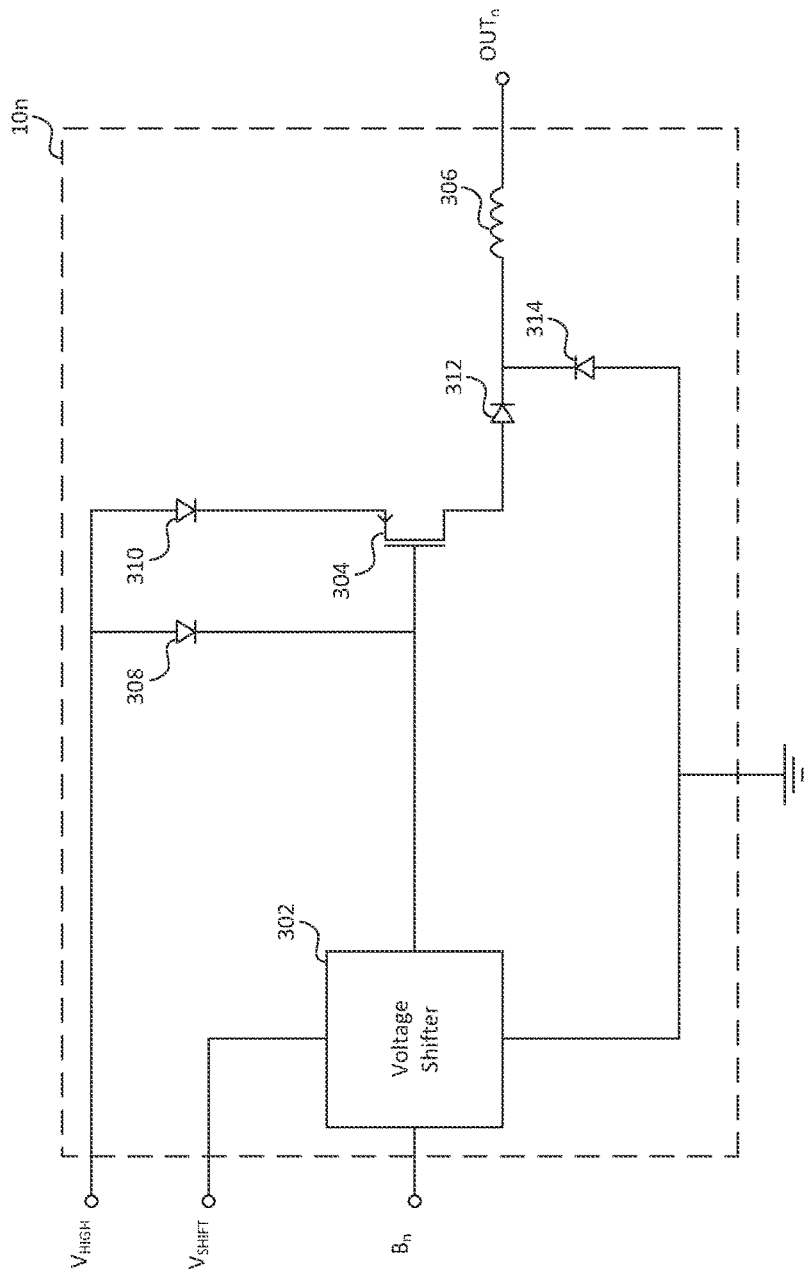
FIG. 3 illustrates an example switching arrangement according to embodiments.

FIG. 3 schematically illustrates an example switched inductor arrangement 10n according to embodiments. Switched inductor arrangement 10n includes voltage shifter 302, switching element 304, inductive element 306, and biasing diodes 308, 310, 312, 314. In some embodiments, switching arrangement 10n may also include one or more further circuit components (not shown).

Voltage shifter 302 is used to raise switch signal Bn, to a level sufficient to operate switching element 304, using shift voltage $V_{SHIFT}$. In some arrangements, shift voltage $V_{SHIFT}$ may be derived from the high voltage $V_{HIGH}$. In some embodiments, voltage shifter 302 may comprise one or more further switching elements (not shown). In further embodiments, voltage shifter 302 may include multiple voltage shifting stages, each of which may utilise a different shift voltage (not shown). In alternative embodiments, voltage shifter 302 may be omitted from switched inductor arrangement 10n, for example if switch signal Bn is sufficient to operate switching element 304 directly. Switching element 304 provides the controllable switching behaviour of switched inductor arrangement 10n. In some embodiments, switching element 304 is an electronic switch. In some embodiments, switching element 304 is a transistor, for example a field-effect-transistor, FET; a metal-oxide-semiconductor field-effect-transistor, MOSFET; a bipolar junction transistor, BJT; or an insulated-gate bipolar transistor, IGBT.

Switching element 304 selectively passes current to inductive element 306. In embodiments, inductive element 306 comprises an inductor. When the switch signal Bn enables switching element 304, current flows from the high voltage supply $V_{HIGH}$, via switching element 304, into inductive element 306, thereby charging inductive element 306 and also contributing a current to the combined output signal OUT, illustrated in FIG. 3 as component output signal OUTn. Thereafter, when the switch signal Bn disables switching element 304, the current flow from the high voltage supply $V_{HIGH}$ into inductive element 306 is inhibited. However, inductive element 306 will then begin to discharge, thereby continuing to deliver component output signal OUTn and contribute current to the combined output signal OUT. Hence, it can be seen that inductive element 306 provides an energy storage and/or low-pass filtering function, which serves to smooth the profile of the component output signal OUTn.

In some embodiments, the control circuitry 110 is configured to operate the switched inductor arrangements 102, 104, 106, 108 in discontinuous mode. In such embodiments, the control circuitry is configured to cause each the switched inductor arrangements 102, 104, 106, 108 to only charge the corresponding inductive element 306 from a discharged state. Control circuitry 110 can ensure this mode of operation, for example, by maintaining a sufficient time separation between disabling a given switching element 304, and subsequently enabling that same switching element again. In embodiments, the duration of the time separation required is proportional to the duration that the given switching element 304 was last enabled. Such operation enables the switched inductor arrangements 102, 104, 106, 108 to be switched when the current through the corresponding inductive element 306 is zero (or negligible) or the voltage across the inductive element 306 is zero (or negligible). This further reduces the requirements on the switching devices 304 used in the switched inductor arrangements 102, 104, 106, 108 in terms of power rating, dissipation characteristics, size and/or cost. Furthermore, such techniques may also act to improve the power efficiency of the switched inductor arrangements 102, 104, 106, 108 due to reduced switching losses.

Unlike a circuit operating in continuous mode, the output of a switched inductor arrangement 102, 104, 106, 108 which is operated in discontinuous mode cannot be individually shaped into any arbitrary waveform. Under discontinuous mode operation, the output of each switched inductor arrangement 102, 104, 106, 108 is likely to be restricted to a series of one or more triangular shaped pulses, each defined by a positive charging slope and a negative discharging slope. However, this limitation may mitigated by certain embodiments of the present disclosure, in which the waveform shape of the combined output signal is instead controlled by the number of switched inductor arrangements which are enabled in parallel. In some embodiments however, the size of the triangular pulses in each component output signal OUTn may be tuned by control circuitry 110, for example by adjusting the duration in which switching element 304 is enabled. By way of example, such tuning may be used to compensate for any variances in the current in the inductive element 306 which occur as the voltage across the inductive element changes, i.e. as a result of the instantaneous voltage of the combined output signal OUT.

In the embodiments described above, a switching element 304 has been described as enabled when current is allowed to pass across it, from the high voltage supply $V_{HIGH}$ into inductive element 306. More generally, a switched inductor arrangement 102, 104, 106, 108, 10n, may be considered enabled which it is contributing current to the combined output signal OUT.

In the embodiments depicted in FIG. 3, switched inductor arrangement 10n is depicted with a buck converter style circuit arrangement. In further embodiments, alternative circuit arrangements may be used for the switched inductor arrangements 102, 104, 106, 108, including a different style of buck converter circuit arrangement, a boost converter arrangement, or a buck-boost converter arrangement, for example. In some such embodiments, where appropriate, the supply voltages may include a low voltage $V_{LOW}$, in addition to, or instead of instead of, high voltage $V_{HIGH}$.

In some arrangements, apparatus 100 may further comprise feedback circuitry (not shown). In some such arrangements the feedback circuitry may be comprised by control circuitry 110. The feedback circuitry may be arranged to compare the combined output signal OUT with a target output waveform. Control circuitry 110 may then vary the number of enabled switched inductor arrangements 102, 104, 106, 108 on the basis of an outcome of the comparison. For example, if the feedback circuitry shows that the combined output signal OUT is greater than the target output waveform, the number of enabled switched inductor arrangements 102, 104, 106, 108 may be decreased. Similarly, if the feedback circuitry shows that the combined output signal OUT is lower than the target output waveform, the number of enabled switched inductor arrangements 102, 104, 106, 108 may be increased.

In embodiments, control circuitry 110 comprises a processor or processing system. In embodiments, the processing system comprises one or more processors and/or memory. One or more aspects of the embodiments described herein with reference to the drawings comprise processes performed by control circuitry 110. In embodiments, the control circuitry 110 comprises one or more processing systems or processors configured to carry out these processes. In this regard, embodiments may be implemented at least in part by computer software stored in (non-transitory) memory and executable by the processor, or by hardware, or a combination of tangibly stored software and hardware (and tangibly stored firmware). Embodiments also extend to computer programs, particularly computer programs on or in a carrier, adapted for putting the above embodiments into practice. The program may be in the form of non-transitory source code, object code, or in any other non-transitory form suitable for use in the implementation of processes according to embodiments. The carrier may be any entity or device capable of carrying the program, such as a RAM, a ROM, or an optical memory device; etc.

The above embodiments are to be understood as illustrative examples of the invention. Further embodiments of the invention are envisaged. For example, it is to be understood that any feature described in relation to any one embodiment may be used alone, or in combination with other features described in the same or different embodiments. Furthermore, equivalents and modifications not described above may be employed without departing from the scope of the invention. For example, in previously described embodiments, the switched inductor arrangements 102, 104, 106, 108 comprise an inductor. However, in further embodiments, the switched inductor arrangements may comprise alternative energy storage or low-pass filtering elements which perform an equivalent function.

The invention claimed is:

1. Apparatus comprising:
   a plurality of switched inductor arrangements connected in parallel to generate a combined output signal; and
   control circuitry to selectively enable each of the plurality of switched inductor arrangements, an enabled switched inductor arrangement comprising a switched inductor arrangement which is contributing current to the combined output signal, wherein the control circuitry is configured to vary the number of enabled switched inductor arrangements to define an arbitrarily shaped waveform from the combined output signal,
wherein the arbitrarily shaped waveform is selectable from a plurality of waveform shapes, the plurality of waveform shapes comprising a sine wave and at least one other waveform shape.

2. Apparatus according to claim 1, wherein at least one of the switched inductor arrangements comprises one or more of:
a buck converter;
a boost converter, and
a buck-boost converter.

3. Apparatus according to claim 1, wherein, the control circuitry is configured to vary the number of enabled switched inductor arrangements over a wavelength of the combined output signal, whereby relatively more switched inductor arrangements are enabled during a peak in an output waveform, and relatively fewer switched inductor arrangements are enabled during a trough in the output waveform.

4. Apparatus according to claim 1, wherein the control circuitry is configured to generate a plurality of switch signals, wherein each switch signal is provided to one or more of the plurality of switched inductor arrangements, and wherein selectively enabling a switched inductor arrangement comprises transitioning a respective switch signal from a first state to a second state.

5. Apparatus according to claim 4, wherein a first switch signal provided to a first subset of the plurality of switched inductor arrangements is asynchronous with respect to a second switch signal provided to a second subset of the plurality of switched inductor arrangements.

6. Apparatus according to claim 4, wherein the control circuitry is configured to generate at least one of the plurality of switch signals by selectively passing a clock signal to at least one corresponding switched inductor arrangement.

7. Apparatus according to claim 1, wherein the control circuitry is configured to enable at least one of the plurality of switched inductor arrangements by selectively passing a clock signal to the respective switched inductor arrangement.

8. Apparatus according to claim 7, wherein the control circuitry is configured to select the clock signal to pass to the respective inductor arrangement from a plurality of possible clock signals.

9. Apparatus according to claim 8, wherein two or more of the plurality of possible clock signals have different frequency and/or duty cycle characteristics.

10. Apparatus according to claim 7, wherein a first clock signal selectively passed to a first subset of the plurality of switched inductor arrangements is different to a second clock signal selectively passed to a second subset of the plurality of switched inductor arrangements.

11. Apparatus according to claim 10, wherein the first clock signal is out of phase with respect to the second clock signal.

12. Apparatus according to claim 11, wherein the first clock signal has a different frequency to the second clock signal.

13. Apparatus according to claim 1, wherein at least two of the plurality of switched inductor arrangements are enabled collectively.

14. Apparatus according to claim 13, wherein the at least two switched inductor arrangements are switched asynchronously.

15. Apparatus according to claim 1, wherein the control circuitry is configured to operate the plurality of switched inductor arrangements in discontinuous mode.

16. Apparatus according to claim 1, wherein each of the plurality of switched inductor arrangements comprises a corresponding inductive element, and wherein the control circuitry is configured to cause a switched inductor arrangement to only charge the corresponding inductive element from a discharged state.

17. Apparatus according to claim 1, comprising feedback circuitry to compare the combined output signal with a target output waveform, wherein the control circuitry is configured to vary the number of enabled switched inductor arrangements on the basis of an outcome of the comparison.

18. Apparatus according to claim 1, wherein each of the plurality of switched inductor arrangements comprises at least one switching element, wherein the at least one switching element comprises:
a field-effect-transistor, FET;
a metal-oxide-semiconductor field-effect-transistor, MOSFET;
a bipolar junction transistor, BJT; or
an insulated-gate bipolar transistor, IGBT.

19. A method comprising:
selectively enabling each of a plurality of switched inductor arrangements, wherein the plurality of switched inductor arrangements are connected in parallel to generate a combined output signal and an enabled switched inductor arrangement comprises a switched inductor arrangement which is contributing current to the combined output signal; and
varying the number of enabled switched inductor arrangements to define an arbitrarily shaped waveform from the combined output signal,
wherein the arbitrarily shaped waveform is selectable from a plurality of waveform shapes, the plurality of waveform shapes comprising a sine wave and at least one other waveform shape.

20. A computer program product comprising a non-transitory computer-readable storage medium having computer readable instructions stored thereon, the computer readable instructions being executable by a computerized device to cause the computerized device to perform a method comprising:
selectively enabling each of a plurality of switched inductor arrangements, wherein the plurality of switched inductor arrangements are connected in parallel to generate a combined output signal and an enabled switched inductor arrangement comprises a switched inductor arrangement which is contributing current to the combined output signal; and
varying the number of enabled switched inductor arrangements to define an arbitrarily shaped waveform from the combined output signal,
wherein the arbitrarily shaped waveform is selectable from a plurality of waveform shapes, the plurality of waveform shapes comprising a sine wave and at least one other waveform shape.

21. Apparatus comprising:
a plurality of switched inductor arrangements connected in parallel to generate a combined output signal; and
control circuitry to selectively enable each of the plurality of switched inductor arrangements, an enabled switched inductor arrangement comprising a switched inductor arrangement which is contributing current to the combined output signal, wherein the control circuitry is configured to vary the number of enabled switched inductor arrangements to define a waveform shape of the combined output signal, the control circuitry configurable to generate waveform shapes comprising sine waves, triangle waves, square waves, and sawtooth waves.

* * * * *